(12) United States Patent
Kim et al.

(10) Patent No.: US 11,963,467 B2
(45) Date of Patent: Apr. 16, 2024

(54) ELECTRONIC DEVICE AND METHOD FOR FABRICATING THE SAME

(71) Applicant: SK hynix Inc., Icheon (KR)

(72) Inventors: Hyo-June Kim, Seoul (KR); Hyun-Seok Kang, Icheon (KR); Chi-Ho Kim, Yongin (KR); Jae-Geun Oh, Seoul (KR)

(73) Assignee: SK hynix Inc., Icheon (KR)

( * ) Notice: Subject to any disclaimer, the term of this patent is extended or adjusted under 35 U.S.C. 154(b) by 21 days.

(21) Appl. No.: 17/744,436

(22) Filed: May 13, 2022

(65) Prior Publication Data

US 2022/0278275 A1 Sep. 1, 2022

Related U.S. Application Data

(62) Division of application No. 16/660,290, filed on Oct. 22, 2019, now Pat. No. 11,362,273.

(30) Foreign Application Priority Data

Mar. 5, 2019 (KR) .......................... 10-2019-0025229

(51) Int. Cl.
*H10B 63/00* (2023.01)
*G11C 13/00* (2006.01)
*H10N 70/00* (2023.01)

(52) U.S. Cl.
CPC ....... *H10N 70/841* (2023.02); *G11C 13/0004* (2013.01); *H10B 63/00* (2023.02); *H10N 70/021* (2023.02)

(58) Field of Classification Search
CPC .. H10N 70/841; H10N 70/021; H10N 70/063; H10N 70/826; H10N 70/231; H10N 70/8616; G11C 13/0004; G11C 2213/71; H10B 63/00; H10B 63/84; H10B 63/20; H10B 63/30; H10B 99/00; H01L 27/0207
See application file for complete search history.

(56) References Cited

U.S. PATENT DOCUMENTS

| | | | | |
|---|---|---|---|---|
| 11,362,273 B2* | 6/2022 | Kim | ...................... | H10N 70/841 |
| 11,581,486 B2* | 2/2023 | Ahn | ...................... | H10B 63/20 |
| 2004/0232496 A1* | 11/2004 | Chen | ...................... | H10B 41/30 |
| | | | | 257/E27.103 |
| 2005/0079721 A1 | 4/2005 | Buerger, Jr. et al. | | |

(Continued)

FOREIGN PATENT DOCUMENTS

| | | |
|---|---|---|
| CN | 1806337 A | 7/2006 |
| CN | 104779347 A | 7/2015 |

(Continued)

*Primary Examiner* — Bitew A Dinke

(57) ABSTRACT

An electronic device includes a semiconductor memory. A method for fabricating the electronic device includes forming a first memory cell extending vertically from a surface of substrate and having a first upper portion that protrudes laterally, forming a second memory cell extending vertically from the surface of the substrate and having a second upper portion that protrudes laterally towards the first upper portion, and forming a liner layer over the first and second memory cells, the liner layer having a first portion disposed over the first upper portion and a second portion disposed over the second upper portion, the first and second portions of the liner layer contacting each other.

8 Claims, 12 Drawing Sheets

(56) References Cited

U.S. PATENT DOCUMENTS

| | | | |
|---|---|---|---|
| 2009/0121208 A1* | 5/2009 | Nagashima | H10B 20/00 257/E47.001 |
| 2010/0034016 A1 | 2/2010 | Liu | |
| 2010/0038616 A1 | 2/2010 | Nagashima et al. | |
| 2010/0237320 A1* | 9/2010 | Nagashima | H10B 63/84 257/E21.602 |
| 2011/0049465 A1* | 3/2011 | Nagashima | H01L 27/0688 438/653 |
| 2012/0074484 A1* | 3/2012 | Kang | H10B 41/40 257/E21.422 |
| 2012/0231603 A1* | 9/2012 | Im | H10N 70/826 257/E21.09 |
| 2013/0087756 A1 | 4/2013 | Joseph et al. | |
| 2013/0308368 A1* | 11/2013 | Nagashima | G11C 13/0061 365/148 |
| 2014/0054537 A1* | 2/2014 | Lee | H10N 70/011 257/4 |
| 2014/0284540 A1* | 9/2014 | Suguro | H10N 70/023 118/723 R |
| 2015/0155290 A1 | 6/2015 | Takekida et al. | |
| 2015/0179706 A1* | 6/2015 | Rocklein | H10N 70/011 257/4 |
| 2015/0287916 A1* | 10/2015 | Campbell | H10N 70/826 438/763 |
| 2016/0005966 A1* | 1/2016 | Kim | H10N 70/801 438/127 |
| 2016/0056208 A1* | 2/2016 | Pellizzer | H10B 63/24 257/5 |
| 2016/0056211 A1* | 2/2016 | Cho | H10B 63/20 257/4 |
| 2016/0133671 A1* | 5/2016 | Fantini | H01L 21/76837 257/4 |
| 2016/0181316 A1* | 6/2016 | Lee | G06F 12/0875 257/532 |
| 2017/0025598 A1* | 1/2017 | Kim | H10N 50/10 |
| 2017/0104152 A1* | 4/2017 | Bae | H10N 50/01 |
| 2017/0358628 A1* | 12/2017 | Fantini | H01L 21/7682 |
| 2018/0358411 A1 | 12/2018 | Fantini et al. | |
| 2018/0358556 A1* | 12/2018 | Kang | H10N 70/231 |
| 2019/0165263 A1* | 5/2019 | Hansen | H10N 70/801 |
| 2019/0181341 A1* | 6/2019 | Choi | H10N 70/063 |
| 2020/0119259 A1* | 4/2020 | Ahn | H10B 63/24 |

FOREIGN PATENT DOCUMENTS

| | | |
|---|---|---|
| KR | 20130087196 A | 8/2013 |
| KR | 20140026176 A | 3/2014 |
| TW | 201138087 A1 | 11/2011 |

* cited by examiner

ELECTRONIC DEVICE AND METHOD FOR FABRICATING THE SAME

CROSS-REFERENCE TO RELATED APPLICATIONS

The present application is a divisional application of U.S. application Ser. No. 16/660,290 filed Oct. 22, 2019, and claims priority of Korean Patent Application No. 10-2019-0025229, entitled "ELECTRONIC DEVICE AND METHOD FOR FABRICATING THE SAME" and filed on Mar. 5, 2019, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on have been demanded. Such semiconductor devices include semiconductor devices that can store data by switching between different resistant states according to an applied voltage or current. Such semiconductor devices include, for example, RRAM (resistive random access memory), PRAM (phase change random access memory), FRAM (ferroelectric random access memory), MRAM (magnetic random access memory), E-fuse, etc.

SUMMARY

The present disclosure describes memory circuits and memory devices, and applications for memory circuits and memory devices in electronic devices or systems. The present disclosure further describes various implementations of an electronic device and a which can improve operating characteristics, facilitate fabricating processes, and reduce defects in the fabricating processes.

In an implementation, an electronic device may include a semiconductor memory, wherein the semiconductor memory may include: a first memory cell extending vertically from a surface of substrate and having a first upper portion that protrudes laterally; a second memory cell extending vertically from the surface of the substrate having a second upper portion that protrudes laterally towards the first upper portion; and a liner layer disposed along a profile of the first and second memory cells, the liner layer having a first portion disposed over the first upper portion and a second portion disposed over the second upper portion, the first and second portions of the liner layer contacting each other.

In another implementation, a method for fabricating an electronic device including a semiconductor memory may include: forming a first memory cell extending vertically from a surface of substrate and having a first upper portion that protrudes laterally; forming a second memory cell extending vertically from the surface of the substrate and having a second upper portion that protrudes laterally towards the first upper portion; and forming a liner layer over the first and second memory cells, the liner layer having a first portion disposed over the first upper portion and a second portion disposed over the second upper portion, the first and second portions of the liner layer contacting each other.

These and other aspects, implementations and associated advantages are described in greater detail in the drawings, the description and the claims.

DETAILED DESCRIPTION

Figure 1:
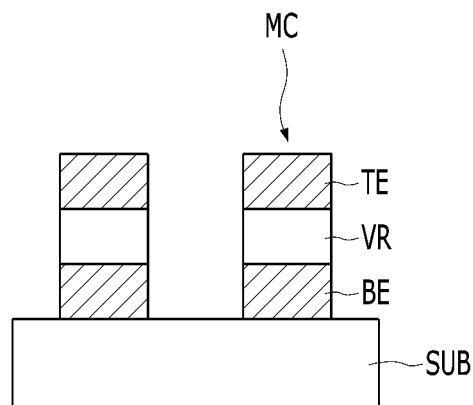
FIG. 1 is a cross-sectional view of a memory device in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of a memory device in accordance with a comparative example.

Referring to FIG. 1, the memory device may include a plurality of memory cells MC formed over a substrate SUB.

Each of the memory cells MC may have a stacked structure of a bottom electrode BE, a variable resistance layer VR, and a top electrode TE.

The variable resistance layer VR may switch between different resistance states according to a voltage or current applied thereto through the bottom electrode BE and the top electrode TE, thereby storing data.

Here, the variable resistance layer VR may include a phase change material. The phase change material may switch between an amorphous state and a crystalline state according to Joule's heat generated by an amount of current flowing thereto through the bottom electrode BE and the top electrode TE, and a cooling time. When the phase change material is in the amorphous state, the phase change material may be in a relatively high resistance state. On the other hand, when the phase change material is in the crystalline state, the phase change material may be in a relatively low resistance state. The variable resistance layer VR may store data using such a resistance difference of the phase change material.

An operation in which the phase change material is changed from the amorphous state to the crystalline state may be referred to as a set operation, and a current required to perform the set operation may be referred to as a set current. Also, an operation in which the phase change material is changed from the crystalline state to the amorphous state may be referred to as a reset operation, and a current required to perform the reset operation may be referred to as a reset current.

When a current is applied to the phase change material and thus a temperature of the phase change material reaches a melting point, the phase change material changes from the crystalline state to the amorphous state. On the other hand, when the current is applied to the phase change material and thus the temperature of the phase change material reaches a crystallization temperature, the phase change material changes from the amorphous state to the crystalline state, the crystallization temperature being lower than the melting point. Therefore, the reset current required for changing the crystalline state to the amorphous state is greater than the set current required for changing the amorphous state to the crystalline state.

However, the heat generated for changing the resistance state of the phase change material may be lost through surroundings, for example, through an insulating material (not shown) filled in spaces between the memory cells MC, so only a portion of the generated heat may be used to change the resistance state of the phase change material. Such heat loss may increase a level of the set current and a level of the reset current to change the resistance state of the phase change material. Particularly, since it is necessary for the temperature of the phase change material to be largely increased in the reset operation, the increase of the reset current may become more problematic.

In addition, when such heat is transmitted to the surroundings, it may cause a thermal disturbance phenomenon that affects a phase change material of the adjacent memory cell MC. The thermal disturbance phenomenon may be further intensified as a memory device becomes highly integrated and thus a distance between memory cells MC becomes closer. Errors may occur in an operation of the memory device due to the thermal disturbance phenomenon and a reliability of the memory device may be deteriorated accordingly.

Hereinafter, there will be introduced a memory device and its manufacturing method, which can solve the above drawbacks by reducing heat loss and/or heat transfer to the surroundings in the memory device.

FIGS. 2A to 6B are views for describing a method of manufacturing a memory device in accordance with an implementation of the present disclosure. FIGS. 2A, 3A, 4A, 5A, and 6A are plan views; FIGS. 2B, 3B, 4B, 5B, and 6B are cross-sectional views taken along a line A-A' of FIGS. 2A, 3A, 4A, 5A, and 6A, respectively; and FIGS. 4C and 5C, are cross-sectional views taken along a line B-B' of FIGS. 4A and 5A, respectively.

Figure 2A:
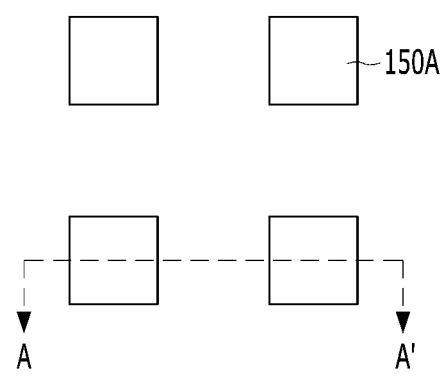
FIGS. 2A, 3A, 4A, 5A, and 6A are plan views for describing a method of manufacturing a memory device in accordance with an implementation of the present disclosure.
Figure 2B:
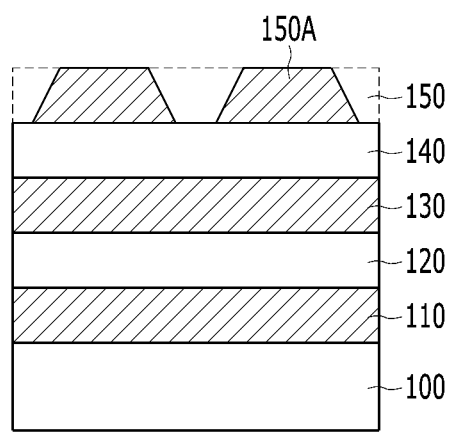
FIGS. 2B, 3B, 4B, 4C, 5B, 5C, and 6B are cross-sectional views for describing the method of manufacturing the memory device in accordance with the implementation of the present disclosure.

Referring to FIGS. 2A and 2B, a substrate 100 in which a required lower structure (not shown) is formed may be provided. For example, the lower structure may include a line such as a word line that is coupled to a lower end of a memory cell so that the word line supplies a voltage or current to the memory cell.

Then, a lower electrode layer 110, a selection element layer 120, an intermediate electrode layer 130, a variable resistance layer 140, and an upper electrode layer 150 may be sequentially stacked over the substrate 100.

The lower electrode layer 110 may be disposed at the lowermost portion of the memory cell to provide a connection between the memory cell and a portion of the substrate 100, for example, the word line. The lower electrode layer 110 may have a single-layered structure or a multi-layered structure including a low-resistance conductive material such as a metal or a metal nitride.

The selection element layer 120 may have a threshold switching characteristic. A current flowing through the selection element layer 120 may be blocked or hardly allowed when a magnitude of a voltage supplied to upper and lower ends of the selection element layer 120 is less than a predetermined threshold voltage. The current flowing through the selection element layer 120 may abruptly increase when the magnitude of the voltage exceeds the threshold voltage Therefore, the threshold switching characteristic of the selection element layer 120 is used to control access to the variable resistance layer 140.

The selection element layer 120 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The intermediate electrode layer 130 may physically separate the selection element layer 120 and the variable resistance layer 140, and electrically connect the selection element layer 120 and the variable resistance layer 140. The intermediate electrode layer 130 may have a single-layered structure or a multi-layered structure including a low-resistance conductive material such as a metal or a metal nitride.

The variable resistance layer 140 may have a variable resistance characteristic that switches between different resistance states depending on a voltage or current supplied to upper and lower ends of the variable resistance layer 140, thereby storing different data corresponding to the different resistance states, respectively. The variable resistance layer 140 may have a single-layered structure exhibiting the variable resistance characteristic by a single layer or a multi-layered structure exhibiting the variable resistance characteristic by a combination of two or more layers.

For example, the variable resistance layer 140 may include a phase change material capable of switching between an amorphous state and a crystalline state by Joule's heat generated according to a current flowing through the variable resistance layer 140. However, implementations are not limited thereto. In another implementation, the variable resistance layer 140 may have a single-layered structure or a multi-layered structure including one or more of materials used for an RRAM, a PRAM, an MRAM, an FRAM, or the like. The materials may include a metal oxide such as a perovskite-based oxide, a transition metal oxide, or the like, a phase change material such as a chalcogenide-based material, a ferromagnetic material, a ferroelectric material, and the like.

The present implementation may be applied to any case where it is necessary to prevent heat loss from a memory cell or heat transfer between adjacent memory cells.

The upper electrode layer 150 may be disposed at the uppermost portion of the memory cell to provide a connection between the memory cell and a conductive element over the memory cell, such as a bit line. The upper electrode layer 150 may include a single-layered structure or a multi-layered structure including a low resistance conductive material such as a metal or a metal nitride.

Then, the upper electrode layer 150 may be selectively etched to form an upper electrode 150A of each memory cell. In a plan view, the upper electrode 150A may have an island shape so that the upper electrodes 150A of a plurality of memory cells may be arranged separately from each other. For convenience of explanation, FIG. 2A shows four upper electrodes 150A that are arranged in a matrix form along a first direction parallel to the A-A' line and a second direction substantially perpendicular to the first direction. However, implementations are not limited thereto. In another implementation, the number and arrangement of the upper electrodes 150A may be variously modified.

In addition, in FIG. 2A, although the upper electrode 150A has a rectangular shape in a plan view, the upper electrode 150A may have a shape that is different from the rectangular shape. For example, the upper electrode 150A may have a shape of a circle, an ellipse, or the like.

In a cross-sectional view, the upper electrode 150A may have a sidewall having an inclined shape such that a side surface thereof forms an acute angle with a surface of the substrate 100. Accordingly, a width of the upper electrode 150A may sharply increase from top to bottom. In an implementation, when a width at an upper portion of the upper electrode 150A is determined depending on the size of a memory cell, the acute angle may be in a range of 45° to 89°. In another implementation, a ratio of the width at a lower portion to a width at the upper portion of the upper electrode 150A is in a range of 1.1 to 2.

The upper electrode 150A having the inclined sidewall shape may be formed by performing an anisotropic etching process using an etching gas. During the anisotropic etching process, a large amount of polymer is generated. The upper electrode 150A having the inclined sidewall shape is obtained as the polymer generated in the etching process is deposited on an etched surface. However, implementations are not limited thereto. In other implementations, the upper electrode 150A, which has a trapezoidal shape or the like having a gradually increasing width, may be obtained through various etching methods.

Figure 3A:
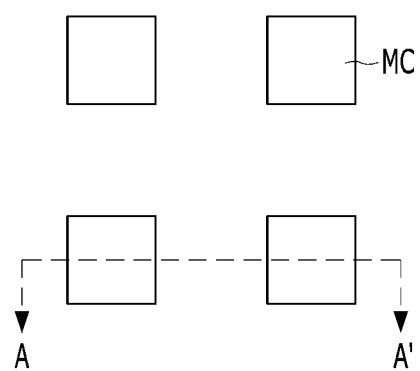
Figure 3B:
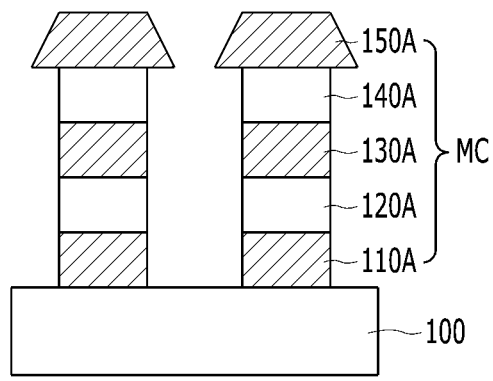

Referring to FIGS. 3A and 3B, the variable resistance layer 140, the intermediate electrode layer 130, the selection element layer 120, and the lower electrode layer 110 may be etched to form a variable resistance pattern 140A, an intermediate electrode 130A, a selection element pattern 120A, and the lower electrode 110A. A stacked structure of the lower electrode 110A, the selection element pattern 120A, the intermediate electrode 130A, the variable resistance pattern 140A, and the upper electrode 150A may be referred to as a memory cell MC. The memory cell MC has a pillar structure.

When etching the variable resistance layer 140, the intermediate electrode layer 130, the selection element layer 120, and the lower electrode layer 110, the upper electrode 150A may be partially etched. However, since the upper electrode 150A may include a material having a lower etch rate than the variable resistance layer 140, the intermediate electrode layer 130, the selection element layer 120, and the lower electrode layer 110, the upper electrode 150A may maintain the inclined sidewall shape after the etching process.

In a plan view, a plurality of memory cells MC may be arranged separately from each other since the plurality of memory cells have an island shape. In FIG. 3A, four memory cells MC are arranged in a matrix form along the first direction and the second direction, but implementations are not limited thereto. In another implementation, the number and arrangement of the memory cells MC may be variously modified. Although FIG. 3A shows the memory cells MC having a rectangular planar shape, a planar shape and a size of each of the lower electrode 110A, the selection element pattern 120A, the intermediate electrode 130A, the variable resistance pattern 140A, and the upper electrode 150A may be different from each other and may be variously modified.

In a cross-sectional view, a width of an upper surface of a remaining portion of the memory cell MC excluding the upper electrode 150A, for example, a width of an upper surface of the variable resistance pattern 140A, may be smaller than a width of a lower surface of the upper electrode 150A in any direction. Therefore, an undercut region may be formed under the upper electrode 150A and an edge of a lower portion of the upper electrode 150A may protrude outwards from a side surface of the remaining portion of the memory cell MC that is located under the upper electrode 150A. For example, the edge of the lower portion of the upper electrode 150A may protrude from a side surface of the variable resistance pattern 140A. Hereinafter, the protruding edge of the lower portion of the upper electrode 150A may be referred to as a protruding portion of the upper electrode 150A.

Furthermore, in FIG. 3B, the remaining portion of the memory cell MC, that is, a stacked structure of the lower electrode 110A, the selection element pattern 120A, the intermediate electrode 130A, and the variable resistance pattern 140A, has a substantially constant width, and thus a side surface of the stacked structure has a substantially vertical shape. In this case, the lower surface of the upper electrode 150A may have a maximum width among all portions of the memory cell MC.

However, implementations are not limited to FIG. 3B. In another implementation, the stacked structure of the lower electrode 110A, the selection element pattern 120A, the intermediate electrode 130A, and the variable resistance pattern 140A may have different widths from each other, or the width of the stacked structure may increase from top to bottom on the assumption that the undercut region is formed under the upper electrode 150A to form the protruding portion of the upper electrode 150A.

For example, the undercut region under the upper electrode 150A may be obtained when the variable resistive layer 140 is etched using an isotropic etching, and thus the upper surface of the variable resistance pattern 140A may have a smaller width than the lower surface of the upper electrode 150A in any direction. Furthermore, by etching the intermediate electrode layer 130, the selection element layer 120, and the lower electrode layer 110 using the isotropic etching, it may be possible to obtain the lower electrode 110A, the selection element pattern 120A, and the intermediate electrode 130A that have a smaller width than the lower surface of the upper electrode 150A. However, implementations are not limited thereto. The remaining portion of the memory cell MC having a smaller width than the lower surface of the upper electrode 150A may be formed through various etching methods.

During the isotropic etching for forming the lower electrode 110A, the selection element pattern 120A, the intermediate electrode 130A, and the variable resistance pattern 140A, the upper electrode 150A may also be etched. Therefore, when forming the protruding portion of the upper electrode 150A, the protruding portion should be formed so that the undercut region still exists under the upper electrode 150A after the isotropic etching.

Figure 4A:
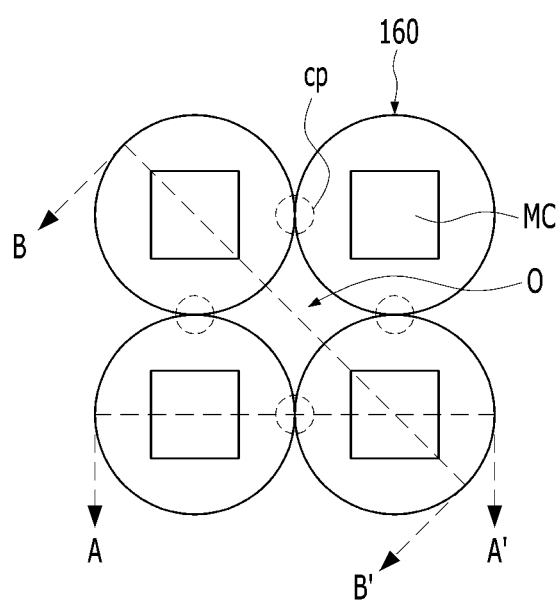
Figure 4B:
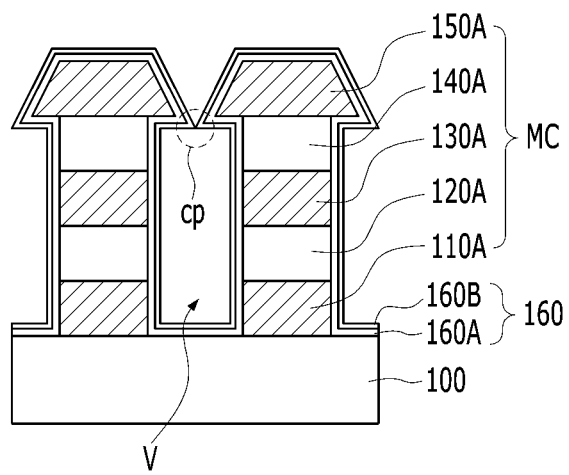
Figure 4C:
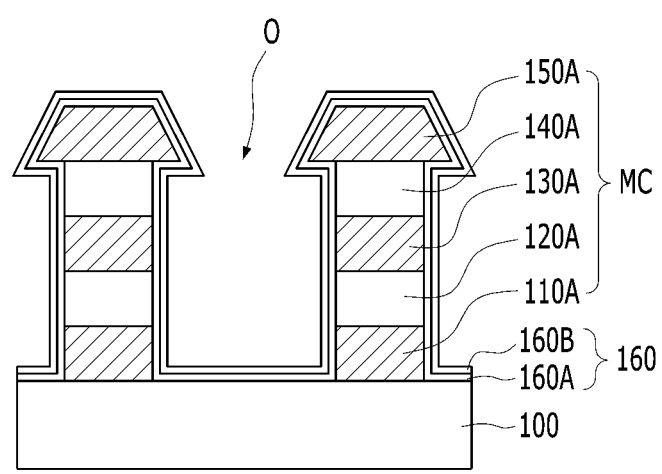

Referring to FIGS. 4A to 4C, a liner layer 160 may be formed along exposed surfaces of the substrate 100 and the memory cell MC.

The liner layer 160 may include a first liner layer 160A and a second liner layer 160B. The first liner layer 160A may encapsulate the memory cell MC to protect the memory cell MC in a subsequent process. For example, the first liner layer 160A may include a nitride such as SiN, SiCN, or the like, to prevent the memory cell MC from being oxidized. The second liner layer 160B may protect an interface between the first liner layer 160A and a material to be buried in a space between the memory cells MC in a subsequent process.

For example, when filling the space between the memory cells MC with a flowable insulating material in a subsequent process, the second liner layer 160B may prevent occurrence of voids in the flowable insulating material. The second liner layer 160B may include an oxide such as $SiO_2$ or the like.

Although, in the present implementation shown in FIGS. 4A to 4C, the liner layer 160 has a double-layered structure of the first liner layer 160A and the second liner layer 160B, implementations are not limited thereto. In another implementation, a liner layer of a single-layered structure or a multi-layered structure in which three or more layers are stacked may be formed along the exposed surfaces of the memory cells MC and the substrate 100.

In another embodiment, the liner layer 160 may have a multi-layered structure in which the first liner layer 160A and the second liner layer 160B are alternately stacked more than one time. Since the number of interfaces increases as the number of layers forming the liner layer 160 increases, heat loss from the memory cell MC and/or heat transfer to the periphery of the memory cell MC may be additionally prevented.

Herein, a portion of the liner layer 160 that is located on the protruding portion of the upper electrode 150A of a certain one of the memory cells MC may be in contact with portions of the liner layer 160 that are located on the protruding portions of the upper electrodes 150A of memory cells MC, which are adjacent to the certain memory cell MC in the first and second directions.

Hereinafter, a portion where the portions of the liner layer 160 of two neighboring memory cells MC are in contact with each other may be referred to as a contact portion CP of the liner layer 160. The contact portion CP may be formed by adjusting a thickness of the liner layer 160 or by adjusting the number of layers forming the liner layer 160.

Referring to FIG. 4A, the liner layer 160 surrounding the certain memory cell MC may have four contact portions CP. The liner layer 160 surrounding the certain memory cell MC may include two contact portions CP which contact the liner layer 160 surrounding two neighboring memory cells MC at both sides of the certain memory cell MC in the first direction. Also, the liner layer 160 surrounding the certain memory cell MC may include two contact portions CP which contact the liner layer 160 surrounding two neighboring memory cells MC at both sides of the certain memory cell MC in the second direction.

In addition, an opening O may be defined by four adjacent contact portions CP of the liner layer 160 surrounding four neighboring memory cells MC arranged in the first and second directions. Accordingly, a space between two neighboring memory cells MC in the first or second direction may be covered by the liner layer 160 located at the contact portion CP, but a space between two adjacent memory cells MC in a third direction may not covered by the liner layer 160, and instead the opening O may exist therein. The third direction may be a diagonal direction with respect to the first and second directions, and correspond to the line B-B'.

Referring to FIG. 4B, the space between the two neighboring memory cells MC in the first or second direction may include a lower space below the contact portion CP of the liner layer 160 and an upper space above the contact portion CP of the liner layer 160. In particular, a void V covered by the liner layer 160 may be formed below the contact portion CP of the liner layer 160. On the other hand, as shown in FIG. 4C, a space between the two adjacent memory cells MC in the third direction may be opened without being covered by the liner layer 160.

The formation of the liner layer 160 as described above may have the following advantages.

Figure 5A:
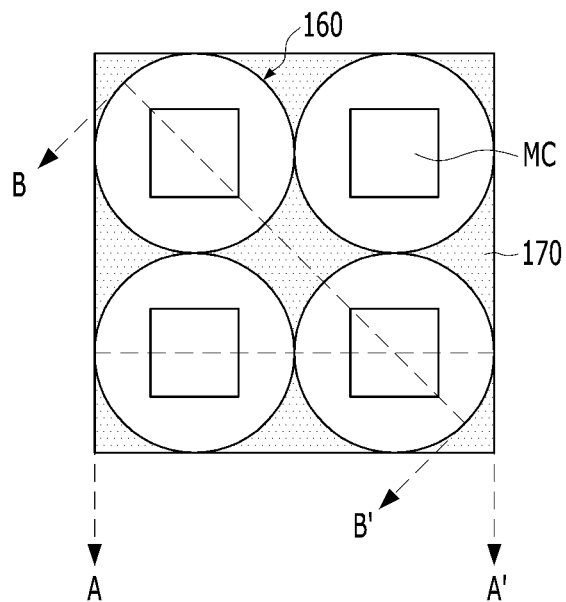
Figure 5B:
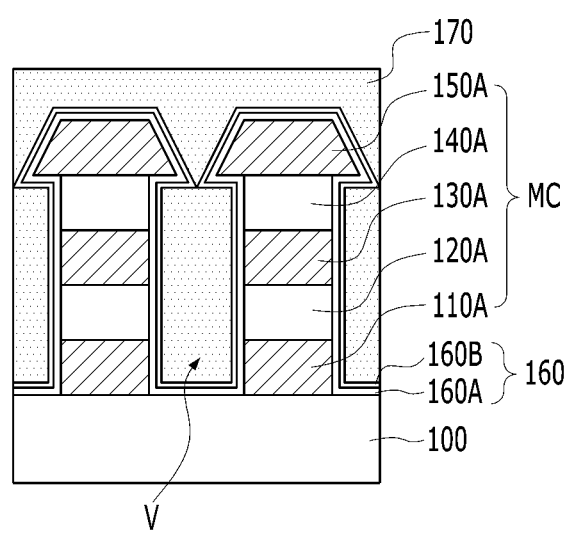

Since the memory cells MC are supported by the contact portions CP of the liner layer 160 after the liner layer 160 is formed and before a subsequent process, e.g., a process to be described with reference to FIGS. 5A and 5B, is performed, leaning of the memory cells MC may be prevented. Therefore, two neighboring memory cells MC arranged in the first or second direction can have an enough space therebetween without a risk of leaning.

FIGS. 5A and 5B show a process of filling the void V with a flowable insulating material. Even if at least a portion of the void V remains without being filled with the flowable insulating material after the filling process because of various reasons, it may be possible to prevent the memory cells MC from leaning since the memory cells MC are supported by the contact portions CP of the liner layer 160.

In addition, since the liner layer 160 is formed along the exposed surface, i.e., a profile, of the memory cell MC, the size of the void V may be maximized. As the size of the void V increases, a volume or amount of the flowable insulating material filling spaces between the memory cells MC may be maximized, so that the advantage of using the flowable insulating material, for example, prevention of heat loss from the memory cell MC and/or heat transfer between the memory cells MC, may be maximized.

Furthermore, the process of filling the void V with the flowable insulating material, shown in FIGS. 5A and 5B, may be possible by securing the opening O.

The above advantages may be secured by simply controlling the thickness of the liner layer 160 so that the contact portions CP are formed between the memory cells MC arranged in the first and second directions. There may be also another advantage that a manufacturing process of the memory device is simplified.

Figure 5C:
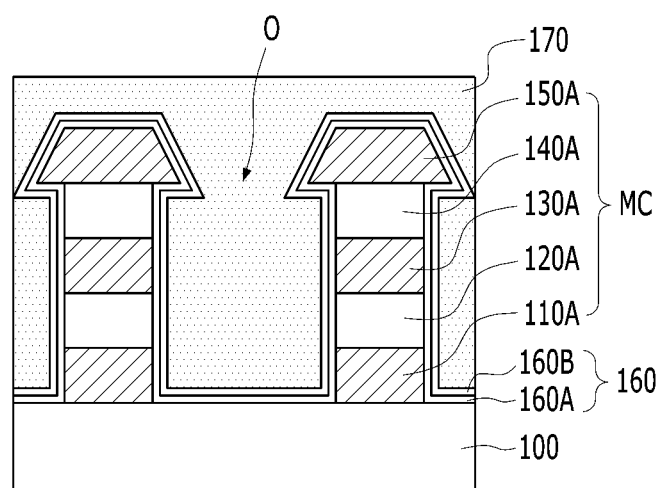

Referring to FIGS. 5A to 5C, a flowable insulating material 170 may be formed to cover a resultant structure of FIGS. 4A to 4C. The flowable insulating material 170 may be provided to fully cover the memory cells MC as well as filling the spaces between the memory cells MC. At this time, the flowable insulating material 170 may be provided through the opening O and fill the void V that is clogged in the first and second directions. In this implementation, the void V is completely filled with the flowable insulating material 170. However, in another implementation, a portion of the void V may remain without being filled with the flowable insulating material 170. Alternatively, the void V may be completely filled with the flowable insulating material 170, but a portion of the flowable insulating material 170 may be lost and thus a portion of the void V may remain.

Here, the flowable insulating material 170 may include a material having a low dielectric constant, for example, a material having a k value of less than 2.5 to sufficiently insulate the memory cells MC from each other. Furthermore, the flowable insulating material 170 may include a material having a low thermal conductivity, for example, a material having a K value of less than 0.04 W/mK to prevent heat loss from the memory cell MC and heat transfer between the memory cells MC. The thermal conductivity of the flowable insulating material 170 may be lower than a thermal conductivity of the liner layer 160. In an implementation, the flowable insulating material 170 may include a SiOC material, and may further include impurities such as hydrogen (H), nitrogen (N), or the like.

The filling process of the flowable insulating material 170 may be omitted. However, when the filling process of the flowable insulating material 170 is omitted, the space between the memory cells MC, for example, the void V, may be in a vacuum state or may be filled with air. Even though a thermal conductivity of the vacuum or air is considerably lower than an oxide, the filling of the flowable insulating material 170 in the space between the memory cells MC such as the void V may be required to prevent the void V from acting as a cause of a process failure in a subsequent process.

As described above, in this implementation, the size of the space between the memory cells MC such as the void V may be maximized by forming the liner layer 160 along the exposed surfaces of the memory cell MC and the substrate 100, and this large space may be filled with the flowable insulating material 170. As a result, the heat loss from the memory cell MC and the heat transfer between the memory cells MC may be minimized and process defects may also be prevented.

Although not shown, the flowable insulating material 170 may be cured through a subsequent process or in the course of time.

Figure 6A:
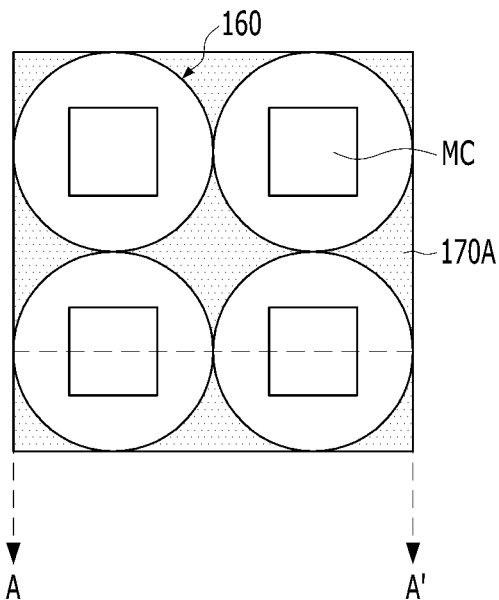
Figure 6B:
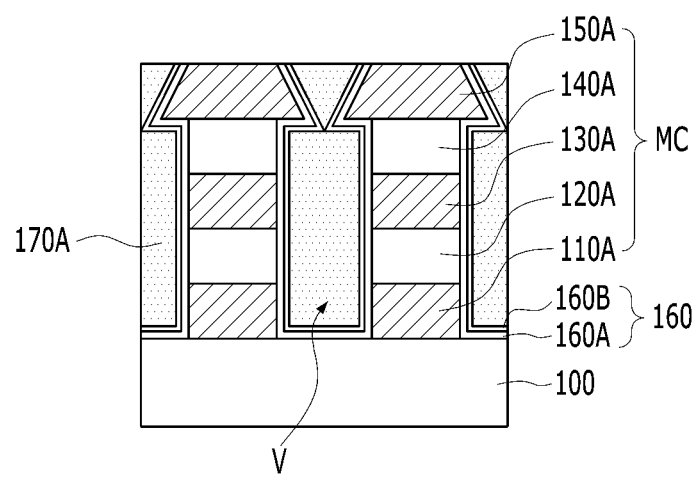

Referring to FIGS. 6A and 6B, a planarization process, for example, a chemical mechanical polishing (CMP) process may be performed on the flowable insulating material 170 and the liner layer 160 until the upper surface of the upper electrode 150A is exposed. A flowable insulating material, which remains between the memory cells MC after the planarization process, is denoted by a reference numeral 170A.

Referring again to FIGS. 6A and 6B, the memory device of the present implementation may include the plurality of memory cells MC formed over the substrate 100 and arranged in the matrix form along the first direction and the second direction.

At least a portion of the side surface of the memory cell MC may have a protruding shape. In this implementation, each of the memory cells MC may include the stacked structure of the lower electrode 110A, the selection element pattern 120A, the intermediate electrode 130A, the variable resistance pattern 140A, and the upper electrode 150A.

The undercut region may be formed under the upper electrode 150A, such that the protruding portion is formed at the lower portion of the upper electrode 150A. The width of the upper surface of the variable resistance pattern 140A may be smaller than the width of the lower surface of the upper electrode 150A in any direction.

Furthermore, the widths of the lower electrode 110A, the selection element pattern 120A, the intermediate electrode 130A, and the variable resistance pattern 140A may be substantially constant and smaller than the width of the lower surface of the upper electrode 150A in any direction. In some cases, in the memory cell MC, at least one of the lower electrode 110A, the selection element pattern 120A, and the intermediate electrode 130A may be omitted.

The liner layer 160 may be formed along the profile of the memory cell MC. Portions of the liner layer 160 that are formed on the protruding portions of the upper electrodes 150A of the neighboring memory cells MC in the first or second direction may contact each other. On the other hand, portions of the liner layer 160 that are formed on the protruding portions of the upper electrodes 150A of the memory cells MC adjacent to each other in the third direction may be spaced apart from each other.

Accordingly, the flowable insulating material 170A may be introduced through the opened space between the memory cells MC in the third direction, and the flowable insulating material 170A may fill the voids V that are surrounded by the liner layer 160 in the first and second directions. As a result, the spaces between the memory cells MC in all directions may be filled with the flowable insulating material 170A.

Here, the flowable insulating material 170A may have a lower thermal conductivity than the liner layer 160, thereby reducing the heat loss from the memory cell MC or the heat transfer between the memory cells MC.

As a result, thermal disturbance due to the heat loss from the memory cell MC or the heat transfer between the memory cells MC can be significantly prevented by forming the liner layer 160 and the flowable insulating material 170A as described above.

Figure 7:
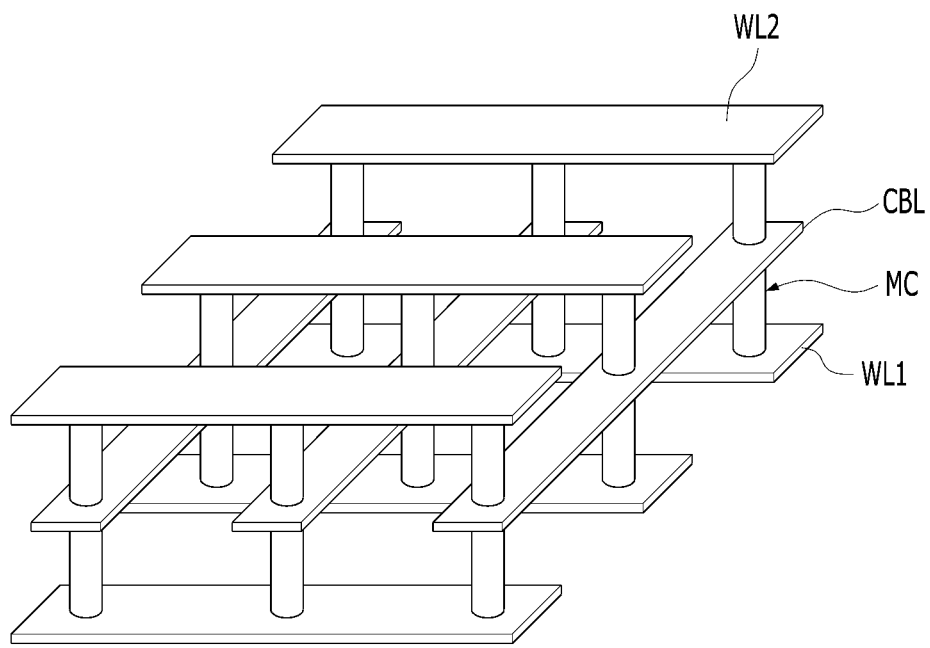
FIG. 7 is a perspective view of a memory device in accordance with another implementation of the present disclosure.

FIG. 7 is a perspective view showing a memory device in accordance with another implementation of the present disclosure.

Referring to FIG. 7, the memory device may include a first stacked structure and a second stacked structure. The second stacked structure is disposed on the first stacked structure in a direction perpendicular to a surface of a substrate (not shown), e.g., in a vertical direction with respect to the orientation of FIG. 7.

The first stacked structure may include first word lines WL1 disposed over the substrate, common bit lines CBL disposed over the first word lines WL1 and extending in a direction substantially perpendicular to the first word lines WL1, and memory cells MC disposed at intersections of the first word lines WL1 and the common bit lines CBL and interposed between the first word lines WL1 and the common bit lines CBL.

Also, the second stacked structure may include the common bit lines CBL, second word lines WL2 disposed over the common bit lines CBL and extending in a direction substantially perpendicular to the common bit lines CBL, and memory cells MC disposed at intersections of the second word lines WL2 and the common bit lines CBL and interposed between the second word lines WL2 and the common bit lines CBL.

Here, the extending directions of the first and second word lines WL1 and WL2 may be any one of the first and second directions described above with reference to FIGS. 2A to 6B, and the extending direction of the common bit lines CBL may be the other of the first and second directions described above.

The memory cells MC shown in FIG. 7 may have substantially the same configurations as the memory cells MC shown in FIGS. 6A and 6B. Accordingly, in FIG. 7, a liner layer may be formed along a profile of the memory cells MC, and a flowable insulating material may be provided in spaces between the memory cells MC on which the liner layer is formed. Here, liner layer portions surrounding the memory cells MC, which are adjacent to each other in the extending direction of the first and second word lines WL1 and WL2 and the extending direction of the common bit line CBL, may have portions that contact each other. On the other hand, liner layer portions surrounding the memory cells MC, which are adjacent to each other in other directions, may be separated from each other.

Although two stacked structures are stacked vertically in this implementation, one stacked structure may be formed, or three or more stacked structures may be vertically stacked.

The above and other memory circuits or semiconductor devices based on the disclosed technology can be used in a range of devices or systems. FIGS. 8-12 provide some examples of devices or systems that can implement the memory devices disclosed herein.

Figure 8:
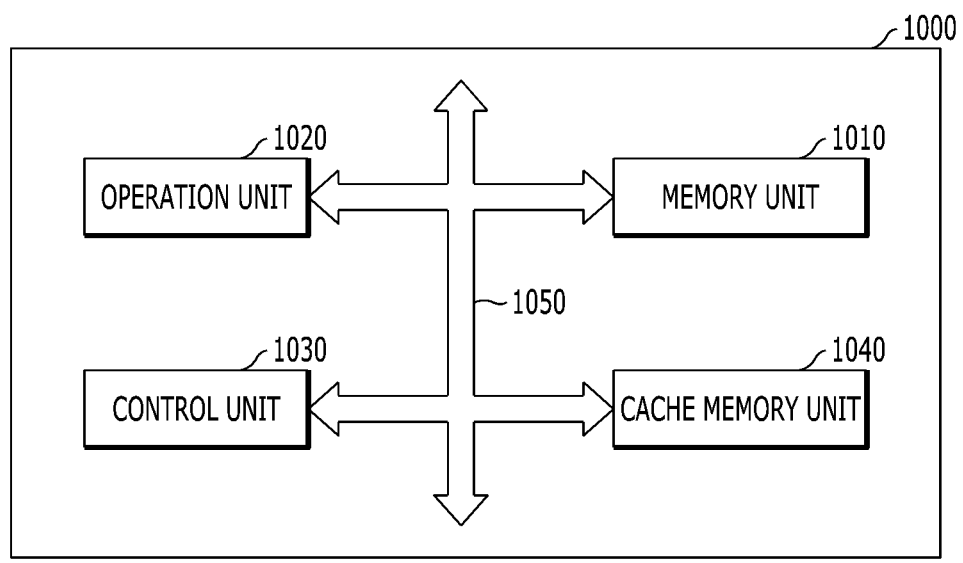
FIG. 8 is an example of a configuration diagram of a microprocessor implementing memory circuitry based on the disclosed technology.

FIG. 8 is an example of a configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register, and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020, and the control unit 1030 through a bus interface 1050.

Figure 9:
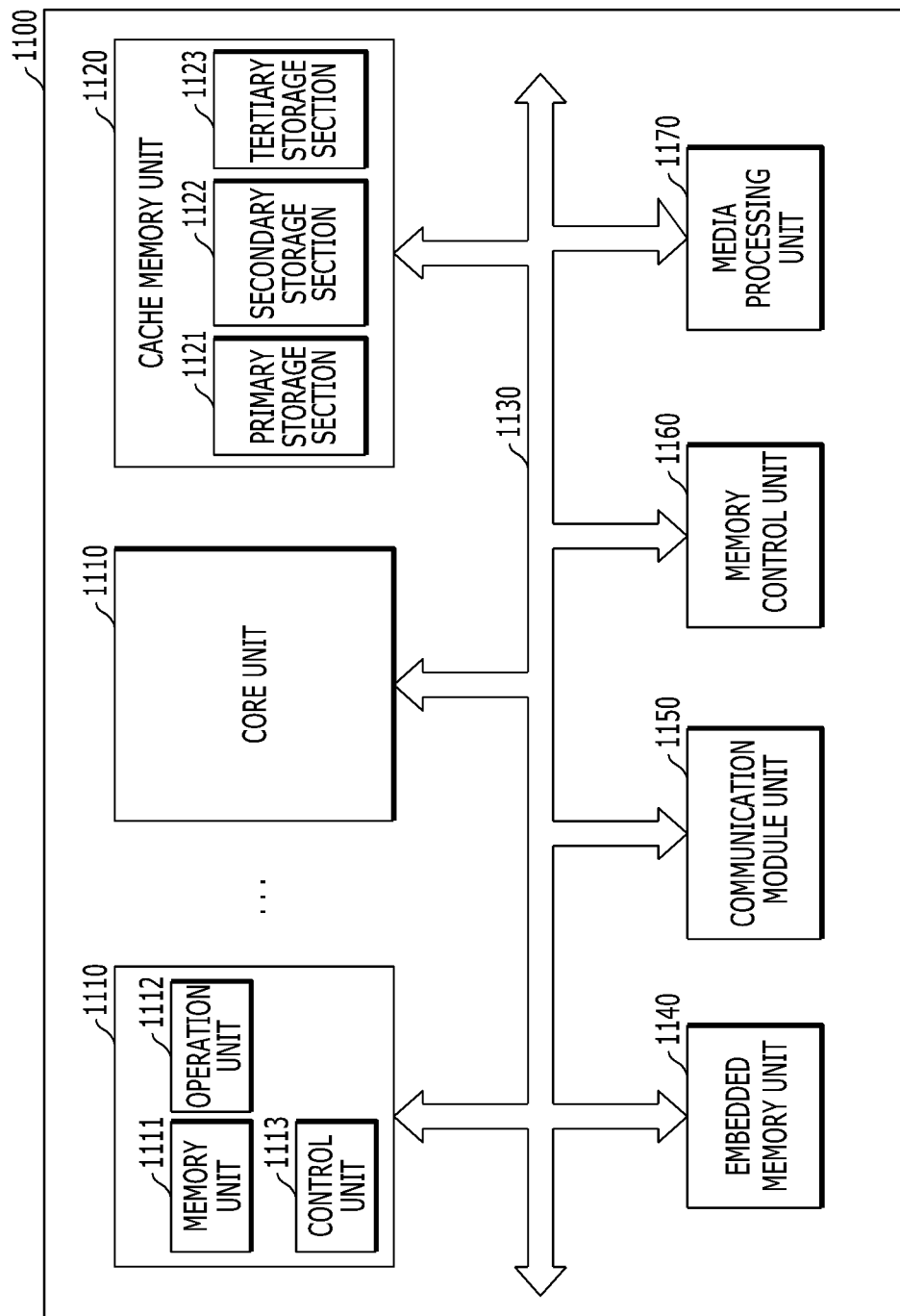
FIG. 9 is an example of a configuration diagram of a processor implementing memory circuitry based on an implementation of the disclosed technology.

FIG. 9 is an example of a configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of the present implementation is a part which performs arithmetic logic operations for data inputted from an external device, and may include a memory unit 1111, an operation unit 1112, and a control unit 1113.

The memory unit 1111 is a part which stores data in the processor 1100, as a processor register, a register, or the like. The memory unit 1111 may include a data register, an address register, a floating point register, and so on. Besides, the memory unit 1111 may include various registers. The memory unit 1111 may perform the function of temporarily storing data for which operations are to be performed by the operation unit 1112, result data of performing the operations and addresses where data for performing the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112, and an external device of the processor 1100, perform extraction, decoding of commands, controlling input and output of signals of processor 1100, and execute processing represented by programs.

The cache memory unit 1120 is a part which temporarily stores data to compensate for a difference in data processing speeds between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasional demands, the cache memory unit 1120 may include an increased number of storage sections. That is to say, the number of storage sections which are included in the cache memory unit 1120 may be changed according to a design. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest. At least one storage section of the primary storage section 1121, the secondary storage section 1122, and the tertiary storage section 1123 of the cache memory unit 1120 may include one or more of the above-described semiconductor devices in accordance with the implementations. For example, the cache memory unit 1120 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the cache memory unit 1120 may be improved. As a consequence, operating characteristics of the processor 1100 may be improved.

Although it is shown in FIG. 9 that all the primary, secondary, and tertiary storage sections 1121, 1122, and 1123 are configured inside the cache memory unit 1120, it is to be noted that all the primary, secondary, and tertiary storage sections 1121, 1122, and 1123 of the cache memory unit 1120 may be configured outside the core unit 1110 and may compensate for a difference in data processing speeds between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speeds. In another implementation, the primary and secondary storage sections 1121 and 1122 may be disposed inside the core units 1110 and the tertiary storage section 1123 may be disposed outside the core units 1110.

The bus interface 1130 is a part which connects the core unit 1110, the cache memory unit 1120, and an external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or a memory with similar functions.

The communication module unit 1150 may include a module capable of being connected with a wired network, a module capable of being connected with a wireless network, or both of them. The wired network module may include a local area network (LAN), a universal serial bus (USB), an Ethernet, power line communication (PLC) such as various devices which send and receive data through transmit lines, or the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, or the like.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
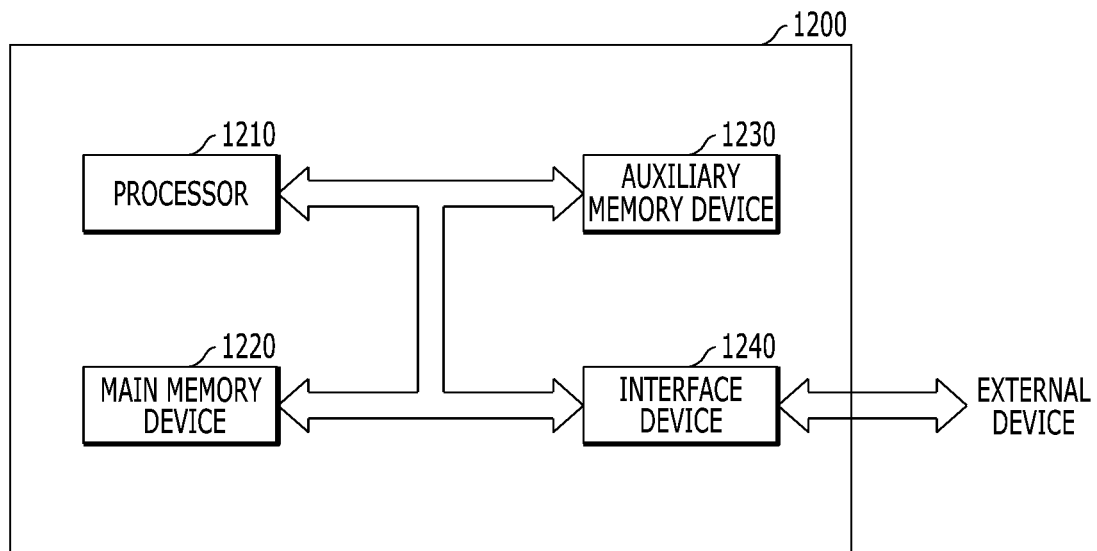
FIG. 10 is an example of a configuration diagram of a system implementing memory circuitry based on the disclosed technology.

FIG. 10 is an example of a configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
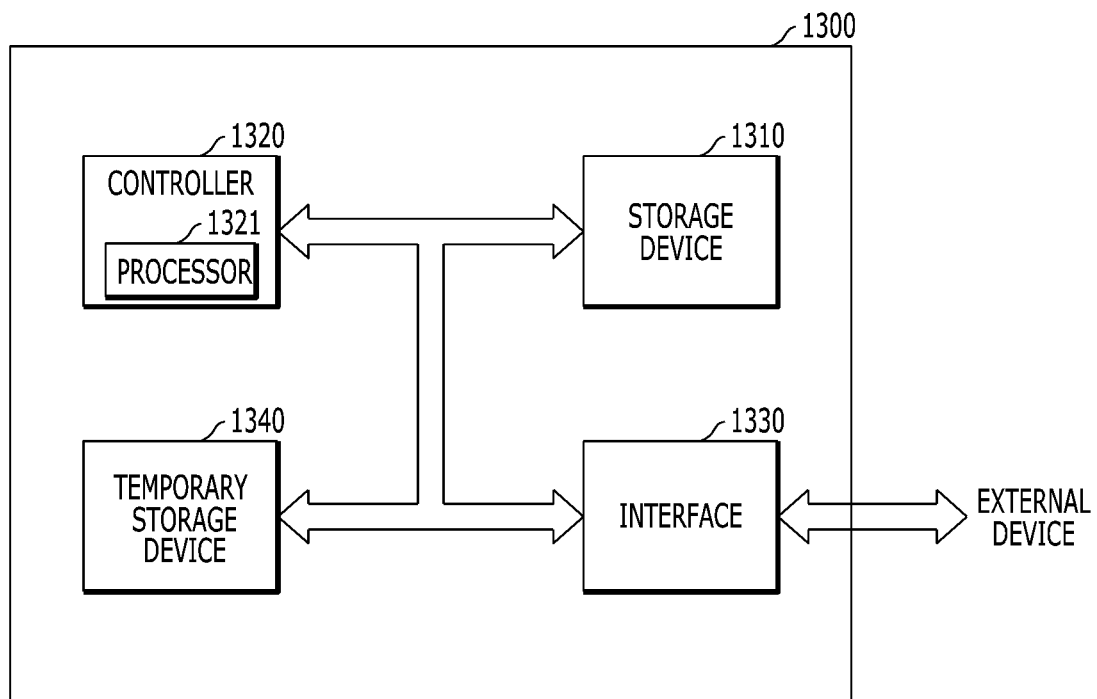
FIG. 11 is an example of a configuration diagram of a data storage system implementing memory circuitry based on the disclosed technology.

FIG. 11 is an example of a configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the storage device 1310 or the temporary storage device 1340 may be improved. As a consequence, operating characteristics and data storage characteristics of the data storage system 1300 may be improved.

Figure 12:
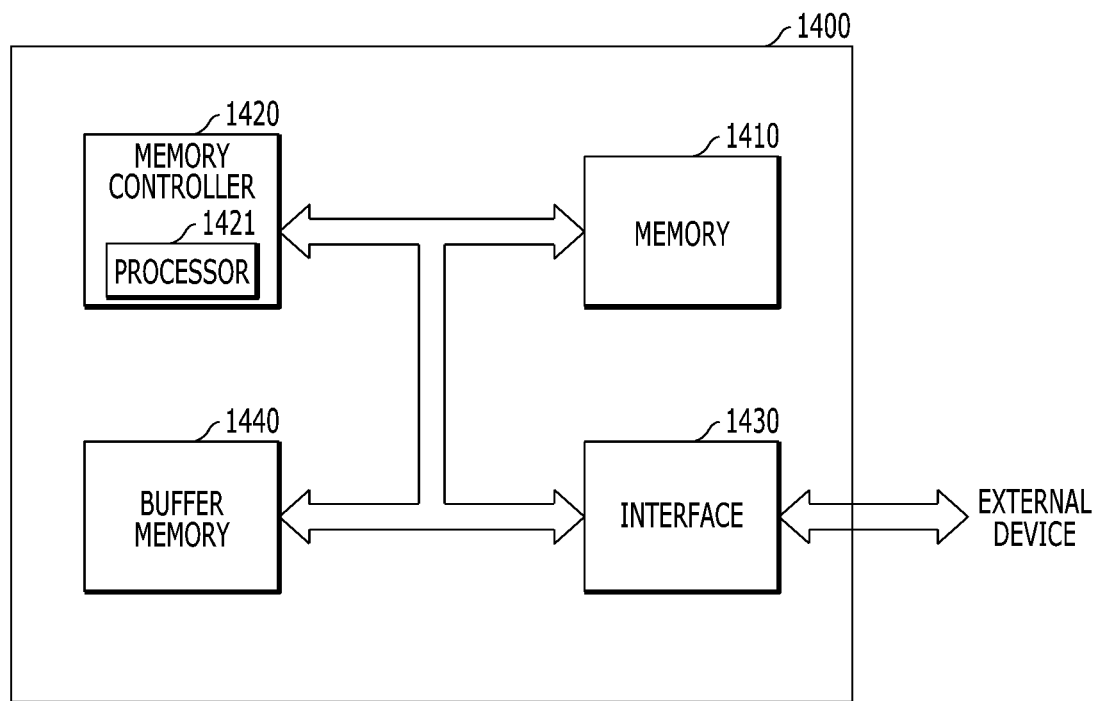
FIG. 12 is an example of a configuration diagram of a memory system implementing memory circuitry based on the disclosed technology.

FIG. 12 is an example of a configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of memory cells formed over a substrate, a side surface of each memory cell including a first portion which is protruded relative to a second portion and the second portion which is located below the first portion; a liner layer formed along the side surface of the memory cell, the memory cells including a first memory cell and a second memory cell adjacent to the first memory cell in a certain direction, and the liner layer located over the first portion of the first memory cell being in contact with the liner layer located over the first portion of the second memory cell; and an insulating material filling at least a portion of a space between the liner layers and having a lower thermal conductivity than the liner layer. Through this, operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, the method comprising:

forming first to fourth memory cells arranged in a matrix form along a first direction and a second direction crossing the first direction, each memory cell having a pillar structure that extends vertically from a surface of a substrate and includes a lower portion and an upper portion over the lower portion, the upper portion having a protruding portion that protrudes laterally beyond a sidewall of the lower portion;

forming a liner layer along the surface of the substrate and an entire side surface of each of the first to fourth memory cells without fully filling spaces between the lower portions of the first to fourth memory cells, wherein the liner layer has a first liner portion disposed over a first protruding portion of the first memory cell, a second liner portion disposed over a second protruding portion of the second memory cell, a third liner portion disposed over a third protruding portion of the third memory cell, and a fourth liner portion disposed over a fourth protruding portion of the fourth memory cell, wherein among the first to fourth memory cells, two neighboring memory cells in the first direction or the second direction contact each other at a contact portion through corresponding liner portions among the first to fourth liner portions so as to provide spaces located under and over the contact portion, and wherein an opening space is defined by the first to fourth liner portions in a plan view and surrounded by the first to fourth liner portions; and providing an insulating material through the opening space so that the insulating material fills the spaces located under and over the contact portion and the opening space, the insulating material having a lower thermal conductivity than the liner layer.

2. The method according to claim 1, wherein the insulating material includes a flowable insulating material that includes SiOC, and wherein the lower portion of each memory cell includes a variable resistance pattern.

3. The method according to claim 1, wherein the upper portion of each memory cell includes an upper electrode, and wherein the upper electrode is formed to have a width increasing from top to bottom so that a side surface of the upper electrode forms an acute angle with the surface of the substrate.

4. The method according to claim 3, wherein the acute angle is in a range of 45° to 89°.

5. The method according to claim 2, wherein the variable resistance pattern includes a phase change material.

6. The method according to claim 1, wherein forming the liner layer comprises:

forming a first liner layer along a profile of the first to fourth memory cells to encapsulate the first to fourth memory cells; and forming a second liner layer over the first liner layer, wherein forming the first liner layer and forming the second liner layer are performed along the profile of the first to fourth memory cells one or more times.

7. The method according to claim 6, wherein the first liner layer includes a nitride.

8. The method according to claim 6, wherein the second liner layer includes an oxide.

* * * * *